(12) United States Patent
Ogawa et al.

(10) Patent No.: US 9,491,846 B2
(45) Date of Patent: Nov. 8, 2016

(54) METHOD OF MANUFACTURING MODULE

(71) Applicant: Murata Manufacturing Co., Ltd., Kyoto-fu (JP)

(72) Inventors: Nobuaki Ogawa, Kyoto-fu (JP); Yoichi Takagi, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 0 days.

(21) Appl. No.: 14/200,901

(22) Filed: Mar. 7, 2014

(65) Prior Publication Data
US 2014/0182918 A1 Jul. 3, 2014

Related U.S. Application Data

(63) Continuation of application No. PCT/JP2012/072549, filed on Sep. 5, 2012.

(30) Foreign Application Priority Data

Sep. 7, 2011 (JP) .................................. 2011-194567

(51) Int. Cl.
*H05K 3/30* (2006.01)
*H05K 1/02* (2006.01)
(Continued)

(52) U.S. Cl.
CPC ......... *H05K 1/0213* (2013.01); *H01L 23/3121* (2013.01); *H01L 23/49811* (2013.01);
(Continued)

(58) Field of Classification Search
CPC ...................... H01L 23/3121; H01L 23/49811; H01L 23/552; H01L 23/49827; H01L 25/0652; H01L 23/5389; H01L 25/0655; H01L 2224/16225; H01L 2924/19105; H01L 2924/19106; H05K 1/0213; H05K 3/32; Y10T 29/49147

USPC ........... 29/830–833, 841, 842, 846; 174/255, 174/260; 257/687, 753, 773; 438/107–110, 438/127, 459

See application file for complete search history.

(56) References Cited

U.S. PATENT DOCUMENTS 6,582,991 B1 * 6/2003 Takata et al. .................. 438/107
7,791,203 B2 * 9/2010 Boon et al. .................... 257/773
(Continued)

FOREIGN PATENT DOCUMENTS

CN  102017142 A  4/2011
JP  2001-118876 A  4/2001
(Continued)

OTHER PUBLICATIONS

Office Action issued in corresponding Japanese Patent Application No. 2013-532615 dated Nov. 4, 2014.
(Continued)

Primary Examiner — Donghai D Nguyen
(74) Attorney, Agent, or Firm — Pearne & Gordon LLP

(57) ABSTRACT

A module 100 can be precisely manufactured by mounting an electronic component 102 and a terminal assembly 10 having a simple configuration, in which a plurality of connection terminals 11 are supported by a support body 12, the configuration being highly precise, inexpensive, and new, on one principal surface of a wiring substrate; and by sealing the electronic component 102 and the terminal assembly 10 mounted on the one principal surface of the wiring substrate 101, with a first resin layer 103. Also, since the plurality of connection terminals 11 are merely supported by the support body 12, the support body 12 can be easily removed from the plurality of connection terminals 11. Accordingly, the manufacturing time of the module 100 is decreased.

9 Claims, 6 Drawing Sheets

(51) Int. Cl.
*H01L 23/31* (2006.01)
*H01L 23/498* (2006.01)
*H01L 23/552* (2006.01)
*H01L 25/065* (2006.01)
*H05K 3/32* (2006.01)
*H01L 23/538* (2006.01)

(52) U.S. Cl.
CPC ..... *H01L23/49827* (2013.01); *H01L 23/5389* (2013.01); *H01L 23/552* (2013.01); *H01L 25/0652* (2013.01); *H05K 3/32* (2013.01); *H01L 25/0655* (2013.01); *H01L 2224/16225* (2013.01); *H01L 2924/19105* (2013.01); *H01L 2924/19106* (2013.01); *Y10T 29/49147* (2015.01)

(56) References Cited

U.S. PATENT DOCUMENTS

| | | | |
|---|---|---|---|
| 8,017,452 B2 * | 9/2011 | Ishihara et al. | 438/127 |
| 2009/0014859 A1 | 1/2009 | Jeung | |
| 2010/0237477 A1 | 9/2010 | Pagaila et al. | |
| 2011/0062584 A1 | 3/2011 | Ishihara | |

FOREIGN PATENT DOCUMENTS

| | | |
|---|---|---|
| JP | 2001-168264 A | 6/2001 |
| JP | 2004-047702 A | 2/2004 |
| JP | 2004-193404 A | 7/2004 |
| JP | 2007-116185 A | 5/2007 |
| JP | 3960479 B1 | 8/2007 |
| JP | 2007-287762 A | 11/2007 |
| JP | 2008-016729 A | 1/2008 |
| JP | 2009-246104 A | 10/2009 |
| JP | 2010-245157 A | 10/2010 |
| JP | 2010-278069 A | 12/2010 |
| WO | 2005/078796 A1 | 8/2005 |
| WO | 2008/065896 A1 | 6/2008 |
| WO | 2009/136496 A1 | 11/2009 |

OTHER PUBLICATIONS

Written Opinion of the International Searching Authority for Application No. PCT/JP2012/072549 dated Dec. 4, 2012.
International Search Report for Application No. PCT/JP2012/072549 dated Dec. 4, 2012.

* cited by examiner

METHOD OF MANUFACTURING MODULE

BACKGROUND OF THE INVENTION

1. Field of the Invention

The present invention relates to a method of manufacturing a module using a plurality of connection terminals that form an interlayer connection conductor, and also relates to a terminal assembly.

2. Description of the Related Art

As shown in an example module of the related art in FIG. 11, there has been known a module 500, in which various types of electronic components 502 are mounted on both surfaces of a wiring substrate 501, are sealed with resin layers 503 (for example, see Patent Document 1). Also, a metal shield layer 504 is provided on one principal surface of the module 500, and mounting terminals 505 for external connection are provided on the other principal surface. The metal shield layer 504 and the mounting terminals 505 are electrically connected with a wiring layer of the wiring substrate 501 through via conductors 506 for interlayer connection.

Each of the via conductors 506 is formed by forming a via hole in the corresponding resin layer 503 provided on the wiring substrate 501 by laser processing, applying desmearing to the via hole, and then filling the via hole with conductive paste containing, for example, Ag or Cu, or applying via fill plating to the via hole. If the via hole is formed in the resin layer 503 by laser processing as described above, the adjustment for the laser output may be troublesome, and hence the formation accuracy of the via hole may vary. Also, since the via conductors 506 are formed in the resin layer 503 through the plurality of steps, the manufacturing cost of the module may be increased, and the many steps may obstruct a decrease in the manufacturing time of the module. Also, a chemical solution used when desmearing is applied to the via holes formed in the resin layer 503 by laser processing or a chemical solution when via fill plating is applied to the via holes may erode the resin layer 503 and the wiring substrate 501.

Therefore, in recent years, as shown in FIG. 12, a terminal assembly 600, in which a plurality of columnar connection terminals 601 that form an interlayer connection conductor are integrally formed with a coupling body 602, is mounted on a wiring substrate 501 by a normal surface mount technology; and hence the interlayer connection conductor of a module is formed by the connection terminals 601 instead of the via conductors 506. Thus, attempts are made to decrease the manufacturing cost of the module and to decrease the manufacturing time of the module (for example, see Patent Document 2). That is, the adjustment for the laser output, or the processing using the chemical solutions, such as desmearing and plating, the processing which has been executed for formation of the via conductors 506 in the resin layer 503 through the plurality of steps including laser processing, is not required, and the module including the interlayer connection conductor can be manufactured by using a normal surface mount technology. FIG. 12 illustrates an example terminal assembly of related art.

Patent Document 1: International Publication No. 2005/078796 (Paragraphs [0017]-[0025], and [0035], FIG. 1, Abstract, etc.)

Patent Document 2: Japanese Unexamined Patent Application Publication No. 2008-16729 (Paragraphs [0015]-[0017], FIG. 4, etc.)

BRIEF SUMMARY OF THE INVENTION

The terminal assembly 600 shown in FIG. 12 is manufactured by integrally forming the plurality of columnar connection terminals 601 with the coupling body 602, by etching, machining, or pressing a material made of Cu. In recent years, as the reduction in size of a communication mobile terminal, such as a cellular phone or a mobile information terminal, progresses, the reduction in size of a module that is mounted on the communication mobile terminal progresses. It is requested that an interlayer connection conductor with a diameter in a range from several tens of μm to several hundreds of μm is formed on the module. However, it is difficult to precisely integrally forming the plurality of connection terminals 601 with the coupling body 602 by machining or pressing with a processing accuracy in a range from several μm to several tens of μm.

If the connection terminals 601 are integrally formed with the coupling body 602 by etching, the degree of progress of etching at base portions of the connection terminals 601 differs from that at tip portions. Hence, the shapes of the connection terminals 601 may vary. Also, if the terminal assembly 600 is formed by etching or machining a material made of Cu, the waste material after etching or machining may be thrown away. The waste is one of the reasons for increasing the manufacturing cost of the terminal assembly 600.

The terminal assembly 600 is mounted on the wiring substrate formed of, for example, a LTCC or a printed substrate, and then the coupling body 602 of the terminal assembly 600 is removed from the connection terminals 601. Hence, the interlayer connection conductor of the module is formed by the connection terminals 601. Since the connection terminals 601 and the coupling body 602 are integrally formed, to remove the coupling body 602 from the terminal assembly 600 mounted on the wiring substrate, the coupling body 602 has to be removed by grinding. The removal is one of the reasons for increasing the manufacturing time of the module.

The invention is made in light of the problems, and a first object is to provide a technology that can precisely manufacture a module and can decrease the manufacturing time of the module, by using a terminal assembly having a simple configuration, in which a plurality of connection terminals that form an interlayer connection conductor are supported by a support body, the configuration being highly precise, inexpensive, and new.

Also, a second object is to provide a terminal assembly having a simple configuration, in which a plurality of connection terminals that form an interlayer connection conductor are supported by a support body, the configuration being highly precise, inexpensive, and new.

To attain the above-described first object, a method of manufacturing a module according to the invention includes a preparing step of preparing a terminal assembly, in which a plurality of columnar connection terminals that form an interlayer connection conductor are supported by a support body; a first mounting step of mounting the terminal assembly and an electronic component on one principal surface of a wiring substrate; and a first sealing step of sealing the electronic component and the terminal assembly mounted on the one principal surface of the wiring substrate, with a first resin layer.

The support body of the terminal assembly on the one principal surface of the wiring substrate may be removed from the connection terminals before the first sealing step.

One ends of the connection terminals may be supported by the support body by bond or adhesion, and the support body may be removed from the connection terminals by decreasing a bond force or an adhesive force of the support body.

The method may further include a step of grinding a surface of the first resin layer after the first sealing step.

The one ends of the connection terminals may be cut away in the grinding step.

The method may further include a second mounting step of mounting an electronic component on the other principal surface of the wiring substrate; and a second sealing step of sealing the electronic component mounted on the other principal surface of the wiring substrate, with a second resin layer.

The terminal assembly may be further mounted on the other principal surface of the wiring substrate in the second mounting step, and the support body of the terminal assembly on the other principal surface of the wiring substrate may be removed from the connection terminals before the second sealing step.

An electronic component may be further mounted on the second resin layer formed in the second sealing step so that the electronic component is connected with the connection terminals of the terminal assembly mounted on the other principal surface of the wiring substrate.

To attain the above-described second object, a terminal assembly according to the invention is mounted on a wiring substrate included in a module, and in the terminal assembly, a plurality of columnar connection terminals that form an interlayer connection conductor of the module are supported by a support body.

The support body may be formed of a plate-shaped member having a bond layer or an adhesive layer formed on one surface of the plate-shaped member, and one ends of the connection terminals may be supported by the support body by bond or adhesion to the one surface of the plate-shaped member.

According to an aspect of the invention, the terminal assembly, in which the plurality of columnar connection terminals that form the interlayer connection conductor are supported by the support body, is prepared. Unlike the terminal assembly of the related art, the connection terminals that are supported by the support body are formed separately from the support body. Accordingly, as compared with the connection terminals of the related art which are integrally formed with the support body, since the connection terminals are formed separately from the support body, the terminal assembly prepared in the preparing step is formed such that the plurality of columnar connection terminals having high processing accuracy and having extremely highly precise shapes are supported by the support body.

Also, the terminal assembly has the simple configuration, in which the plurality of connection terminals are supported by the support body, and there is no material which is etched or cut, and thrown away when the terminal assembly is prepared unlike the case of the related art. Accordingly, the cost for preparing the terminal assembly is decreased. Therefore, the module can be precisely manufactured by mounting the electronic component and the terminal assembly having the simple configuration, in which the plurality of connection terminals are supported by the support body, the configuration being highly precise, inexpensive, and new, on the one principal surface of the wiring substrate; and by sealing the electronic component and the terminal assembly mounted on the one principal surface of the wiring substrate, with the first resin layer.

Also, the plurality of connection terminals are merely supported by the support body, and the connection terminals and the support body are formed separately from each other. As compared with the terminal assembly having the integrated structure of the related art, the support body can be easily removed from the plurality of connection terminals. Accordingly, the manufacturing time of the module can be decreased.

According to another aspect of the invention, the support body of the terminal assembly on the one principal surface of the wiring substrate is removed from the connection terminals before the first sealing step. Accordingly, the filling performance of the resin charged onto the one principal surface of the wiring substrate for forming the first resin layer is increased. Also, when the resin is charged onto the one principal surface of the wiring substrate, the support body of the terminal assembly mounted on the one principal surface has been removed. Accordingly, the air easily escapes, and a void can be prevented from being generated in the first resin layer.

Also, since the support body of the terminal assembly mounted on the one principal surface of the wiring substrate has been removed, resin in any of various forms, such as liquid-state resin or a resin sheet, can be used for forming the first resin layer. The first resin layer can be easily formed by any of generally known various methods.

According to another aspect of the invention, the one ends of the connection terminals are supported by the support body by the adhesion or the pressure sensitive adhesion, and the support body can be easily removed from the connection terminals by decreasing the bond force or the adhesive force of the support body, by heating etc.

According to another aspect of the invention, since the surface of the first resin layer is grinded after the first sealing step, the surface of the first resin layer can be flattened. Also, since the surface of the first resin layer is grinded, the height of the module to be provided can be decreased.

According to another aspect of the invention, the one ends of the connection terminals are cut away together with the surface of the first resin layer in the grinding step. Accordingly, lands for external connection formed of the one ends of the connection terminals can be formed at the surface of the first resin layer.

According to another aspect of the invention, the electronic component is mounted on the other principal surface of the wiring substrate, and the electronic component mounted on the other principal surface of the wiring substrate is sealed with the second resin layer. Accordingly, the mounting density of electronic components that are mounted on the module can be increased. This configuration is practical.

According to another aspect of the invention, the terminal assembly is further mounted on the other principal surface of the wiring substrate. Accordingly, an interlayer connection conductor provided by the connection terminals can be formed in the second resin layer. Also, the support body of the terminal assembly on the other principal surface of the wiring substrate is removed from the connection terminals before the electronic component and the terminal assembly mounted on the other principal surface of the wiring substrate are sealed with the second resin layer. Accordingly, the resin for forming the second resin layer can be efficiently charged onto the other principal surface of the wiring substrate.

According to another aspect of the invention, the electronic component is further mounted on the second resin layer formed in the second sealing step so that the electronic component is connected with the connection terminals of the terminal assembly mounted on the other principal surface of the wiring substrate. Accordingly, the mounting density of electronic components that are mounted on the module can be further increased. This configuration is practical.

According to another aspect of the invention, the terminal assembly is formed such that the plurality of columnar connection terminals that form the interlayer connection conductor are supported by the support body. Unlike the terminal assembly of the related art, the connection terminals that are supported by the support body are formed separately from the support body. Accordingly, as compared with the connection terminals of the related art which are integrally formed with the support body, since the connection terminals are formed separately from the support body, the plurality of columnar connection terminals having extremely highly precise shapes are supported by the support body.

Also, the terminal assembly has the simple configuration, in which the plurality of connection terminals are supported by the support body, and there is no material which is etched or cut, and thrown away when the terminal assembly is manufactured unlike the case of the related art. The manufacturing cost of the terminal assembly is decreased. Accordingly, the terminal assembly having the simple configuration, in which the plurality of connection terminals are supported by the support body, the configuration being highly precise, inexpensive, and new, can be provided.

According to another aspect of the invention, the support body is formed of the plate-shaped member having the bond layer or the adhesive layer formed on the one surface of the plate-shaped member, and the one ends of the connection terminals are supported by the support body by the adhesion or the pressure sensitive adhesion to the one surface of the plate-shaped member. Accordingly, the terminal assembly with the extremely practical configuration can be provided.

DETAILED DESCRIPTION OF THE INVENTION

First Embodiment

Figure 1:
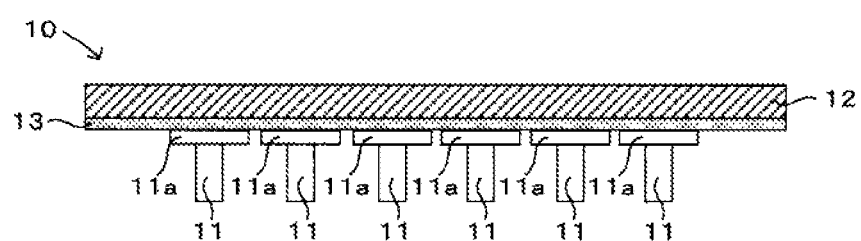
FIG. 1 illustrates a terminal assembly used for a module according to a first embodiment of the invention.
Figure 2:
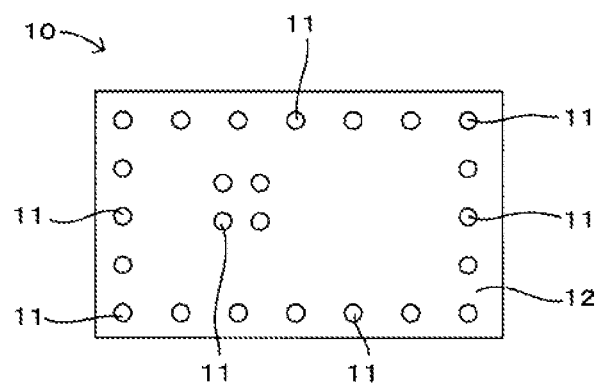
FIG. 2 is a bottom view of the terminal assembly used for the module according to the first embodiment of the invention.
Figure 3:
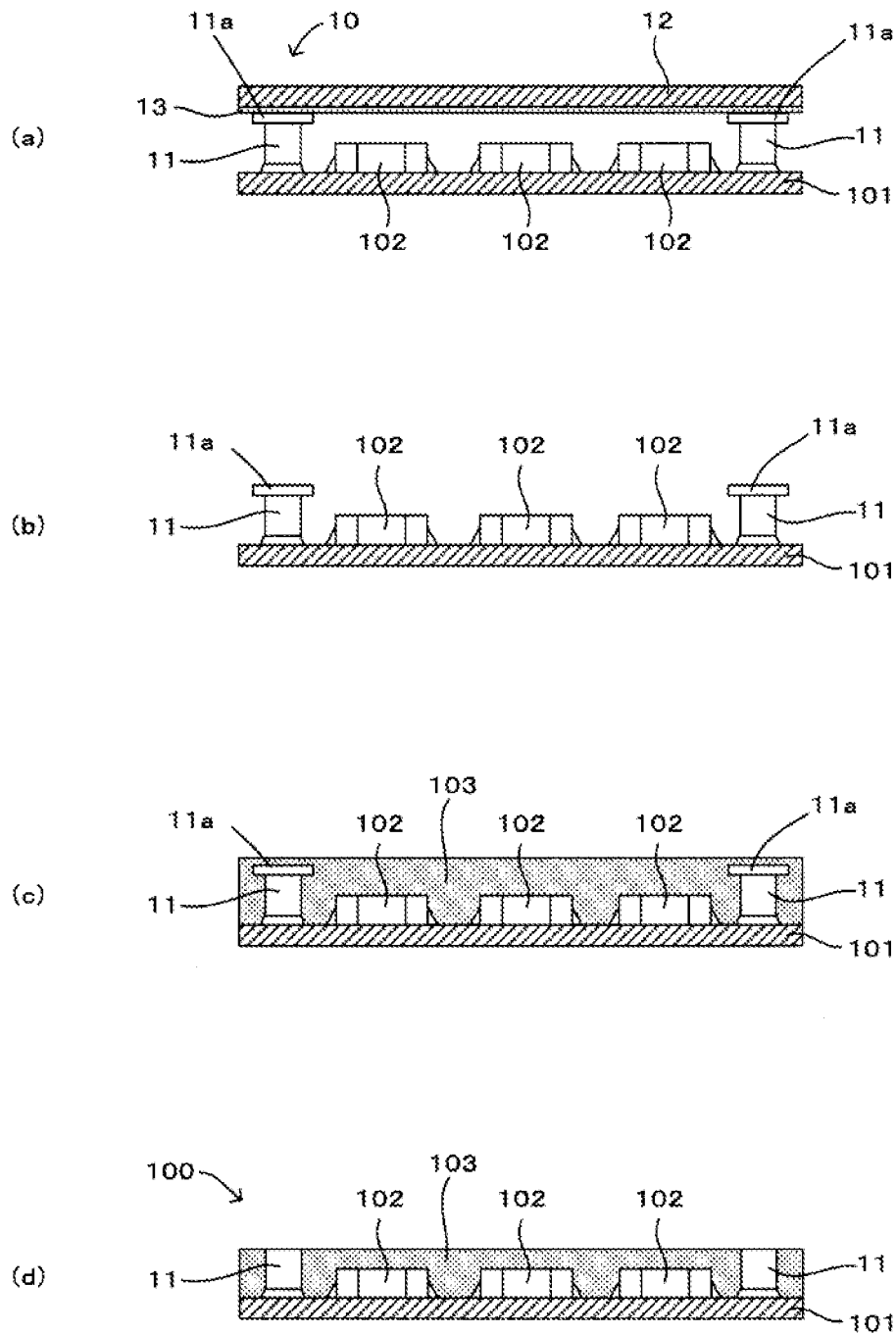
FIGS. 3(a)-(d) illustrate a method of manufacturing the module according to the first embodiment of the invention.

A module according to a first embodiment of the invention is described with reference to FIGS. 1 to 3. FIG. 1 illustrates a terminal assembly used for the module according to the first embodiment of the invention. FIG. 2 is a bottom view of the terminal assembly used for the module according to the first embodiment of the invention. FIG. 3 illustrates a manufacturing method of the module according to the first embodiment of the invention, FIG. 3(a) to FIG. 3(d) showing respectively different steps.

With a method of manufacturing the module described in this embodiment, a high-frequency circuit module that are to be mounted to the mother boards of the communication mobile terminals such as various types of communication modules, such as a Bluetooth (registered trademark) module and a wireless LAN module; an antenna switch module; a power supply module are manufactured.

(Method of Manufacturing Terminal Assembly, and Terminal Assembly)

A terminal assembly 10 including a plurality of columnar connection terminals 11 that form an interlayer connection conductor of a module 100 shown in FIG. 3(d), and being mounted on a wiring substrate 101 of the module 100 is described. As shown in FIGS. 1 and 2, the terminal assembly 10 includes the columnar connection terminals 11 that form the interlayer connection conductor of the module 100 when the connection terminals 11 are mounted on the wiring substrate 101, and a plate-shaped support body 12. The plurality of connection terminals 11 are supported at predetermined positions on one surface of the support body 12 with a support layer 13 interposed therebetween.

Each of the connection terminals 11 may be a metal pin made of a metal conductor, such as Cu, an alloy, in which Fe is mixed into Cu by a ratio in a range from 0.1% to 20%, Au, Ag, or Al. Since the connection terminal 11 is made of an alloy having a hardness that is increased because Fe is mixed into Cu, a burr and the like can be prevented from being generated when the connection terminal 11 is cut. Hence, processing accuracy, for example, when the connection terminal 11 is cut, can be increased. Alternatively, a wire rod of a metal conductor having a desirable diameter and having a circular or a polygonal cross-sectional shape is sheared by a predetermined length. Hence, the connection terminal 11 is formed in a shape of a cylindrical column or a polygonal column.

In this embodiment, the wire rod of the metal conductor is sheared, and then the sheared portion is pressed in the axial direction of the connection terminal 11. Hence, a flange-shaped protruding portion 11a is formed at one end of the connection terminal 11.

With the protruding portion 11a, the contact area between the support layer 13 and the one end of the connection terminal 11 is increased, and hence the one end of the connection terminal 11 can be reliably supported by the support layer 13 by bond or adhesion. While the plate-shaped member forming the support body 12 may be made of any material; however, for example, if the terminal assembly 10 is mounted on the wiring substrate 101 of the module 100 by soldering, the support body 12 is preferably formed of a plate-shaped member of a material which is not deformed with heat during reflowing.

The support layer 13 of the support body 12 may be formed by applying a liquid-state bond or a liquid-state adhesive on one surface of the plate-shaped member, or by attaching a sheet-shaped bond sheet or a sheet-shaped adhesive sheet on the one surface of the plate-shaped member. The support layer 13 has a thickness being as small as possible to prevent an error from being generated in heights of the connection terminals 11 when the connection terminals 11 are mounted on the wiring substrate 101 of the module 100 and to prevent the connection terminals 11 from being tilted. The support layer 13 is preferably formed by a thickness of 100 μm or smaller, or more preferably 50 μm or smaller.

Also, the bond or the adhesive for forming the support layer 13 may be an epoxy based or acryl based adhesive. For example, the support layer 13 may be formed of an adhesive having a characteristic that is softened if being heated at a predetermined temperature or higher and hardened if being cooled. If the support layer 13 is formed of the adhesive having such a characteristic, in a state in which the terminal assembly 10 is stored, the support layer 13 of the support body 12 is hardened. Accordingly, dust and the like can be prevented from adhering to the support layer 13 of the support body 12 of the terminal assembly 10 in storage.

The terminal assembly 10 may be manufactured by any method; however, the terminal assembly 10 may be manufactured by, for example, inserting. The terminal assembly 10 may be manufactured by inserting the connection terminals 11 into respective transfer holes each having a larger diameter than the diameter of each connection terminal 11 so that one ends of the connection terminals 11 protrude from the transfer holes; pressing the support body to the one ends of the connection terminals 11 and causing the support body to support the connection terminals 11; and then removing the support body from the insert jig.

As described above, terminal assemblies 10 may be manufactured for respective corresponding modules 100. Alternatively, terminal assemblies 10 may be manufactured by forming an assembly of a plurality of terminal assemblies 10 and then dividing the assembly into individual pieces of terminal assemblies 10.

Also, the protruding portion may not be provided at one end of each connection terminal 11.

(Method of Manufacturing Module)

A method of manufacturing the module 100, in which the terminal assembly 10 and electronic components 102 are mounted on the wiring substrate 101 and sealed with resin, is described.

First, the terminal assembly 10, in which the plurality of columnar connection terminals 11 that form the interlayer connection conductor of the module 100 are supported by the support body 12, is prepared (the preparing step). Then, as shown in FIG. 3(*a*), the terminal assembly 10 and the electronic components 102, such as various types of chip components and ICs, are mounted at predetermined positions on the one principal surface of the wiring substrate 101 by a typical surface mount technology, such as solder reflowing or supersonic vibration bonding (the first mounting step).

In this embodiment, the wiring substrate 101 is a multilayer ceramic substrate formed by laminating a plurality of ceramic green sheets and firing the multilayer body. The ceramic green sheets are each a slurry in a sheet form in which mixed powder of alumina, glass, etc., is mixed with an organic binder, a solvent, etc. Via holes are formed by laser processing or the like at predetermined positions of the ceramic green sheets, the formed via holes are filled with conductive paste containing Ag, Cu, etc., and hence the via conductors for interlayer connection are formed. Various electrode patterns are formed by printing with conductive paste. Then, the ceramic green sheets are laminated and press-bonded, and hence a ceramic multilayer body is formed. The ceramic multilayer body is fired by low-temperature firing at a low temperature around about 1000° C. Thus, the wiring substrate 101 is formed.

The wiring substrate 101 includes various electrode patterns such as an inner wiring pattern, mounting electrodes on which the terminal assembly 10 and the electronic components 102 are mounted, and external connection electrodes. The wiring substrate 101 may be formed of a printed substrate using a resin or polymer material, a LTCC, an alumina based substrate, a glass substrate, a composite material substrate, a single-layer substrate, or a multilayer substrate. The wiring substrate 101 may be formed by appropriately selecting an optimal material in accordance with the intended use of the module 100.

Next, as shown in FIG. 3(*b*), the support body 12 of the terminal assembly 10 mounted on the one principal surface of the wiring substrate 101 is removed from the connection terminals 11. In this embodiment, the protruding portions 11*a* formed at the respective one ends of the connection terminals 11 are supported by the support layer 13 of the support body 12 by bond or adhesion. By decreasing a bond force or an adhesive force of the support layer 13 of the support body 12, the support body 12 is removed from the connection terminals 11.

For example, if the support layer 13 is formed of an epoxy based thermosetting bond or adhesive, the bond force or the adhesive force of the support layer 13 may be decreased by heating the support layer 13 at its glass transition temperature (Tg) or higher, and the support body 12 may be removed from the connection terminals 11. In this case, when heat is applied for decreasing the bond force or the adhesive force of the support layer 13, the glass transition temperature of the support layer 13 is preferably about 200° C., which is a melting temperature of the solder, or lower so that the solder for joining the terminal assembly 10 and the electronic components 102 with the wiring substrate 101 is not molten.

For example, if the support layer 13 is formed of an acryl based bond or adhesive, the bond force or the adhesive force of the support layer 13 may be decreased by using an alkaline surface-active agent, ethyl acetate, or the like, and the support body 12 may be removed from the connection terminal 11.

Then, as shown in FIG. 3(*c*), resin is charged onto the one principal surface of the wiring substrate 101, and hence the electronic components 102 and the terminal assembly 10 mounted on the one principal surface of the wiring substrate 101 are sealed with the first resin layer 103 (the first sealing step). The first resin layer 103 may be formed of a composite resin made by mixing an inorganic filler, such as aluminum oxide, silica (silicon dioxide), or titanium dioxide, to thermosetting resin, such as epoxy resin, phenol resin, or cyanate resin.

For example, if the first resin layer 103 is formed by using a resin sheet, which is formed by molding a composite resin on a PET film and semi-hardening the resin, the resin sheet is covered on the wiring substrate 101 while spacers (dies) having a desirable thickness are arranged along the periphery, the resin sheet is pressed with heat so that the thickness of the resin meets the thickness of the spacers, then the wiring substrate 101 is heated in an oven to harden the resin, and thus the first resin layer 103 with a desirable thickness can be formed. The first resin layer 103 may be formed by using a typical molding technology for forming a resin layer, such as a potting technology with use of liquid-state resin, a transfer molding technology, or a compression molding technology.

Then, as shown in FIG. 3(d), the surface of the first resin layer 103 is grinded by a roller blade or the like. Hence, unnecessary resin is removed, the surface of the first resin layer 103 is flattened, and the one ends of the connection terminals 11 are exposed (the grinding step). Accordingly, the module 100, in which terminals (lands) for external connection are formed by the one ends of the connection terminals 11 exposed at the surface of the first resin layer 103, is completed.

If the heights of the connection terminals 11 from the wiring substrate 101 vary in accordance with the thickness of the solder for connecting the other ends of the connection terminals 11 with the wiring substrate 101, the one ends of the connection terminals 11 may be cut away together with the first resin layer 103, so that the heights of the connection terminals 11 from the wiring substrate 101 can be aligned. Also, for example, Ni/Au plating may be applied to the one ends of the connection terminals 11 exposed at the surface of the first resin layer 103.

In this embodiment, when the surface of the first resin layer 103 is grinded, the one ends of the connection terminals 11 are grinded together with the resin layer 103, and hence the entire protruding portions 11a formed at the one ends of the connection terminals 11 are removed. If the entire protruding portions 11a are removed, the cross sections of the connection terminals 11 are exposed at the first resin layer 103, as terminals for external connection. Hence, the terminals for external connection provided at the surface of the first resin layer 103 can have uniform areas.

In the first sealing step, if the first resin layer 103 is formed so that the one ends of the connection terminals 11 are exposed, the step of grinding the surface of the first resin layer 103 does not have to be executed.

Alternatively, the first resin layer 103 may be formed by charging the resin onto the one principal surface of the wiring substrate 101 while the support body 12 of the terminal assembly 10 is not removed from the connection terminals 11. In this case, in the grinding step, the support body 12 of the terminal assembly 10 may be removed by grinding, together with the first resin layer 103.

As described above, modules 100 may be individually manufactured. Alternatively, an assembly of a plurality of modules 100 may be formed and then the assembly may be divided into individual pieces of modules 100. In this case, when the plurality of terminal assemblies 10 are mounted on an assembly of wiring substrates 101, the assembly of the terminal assemblies 10 before division may be mounted on the assembly of the wiring substrates 101. With this configuration, the mounting time of the terminal assemblies 10 onto the wiring substrate 101 can be decreased, and hence the manufacturing time of the module 100 can be decreased.

Alternatively, when the plurality of terminal assemblies 10 are mounted on the assembly of the wiring substrates 101, the plurality of terminal assemblies 10 after division may be individually mounted on respective positions corresponding to the individual modules 100 of the assembly of the wiring substrates 101. In this way, the terminal assembly 10 can be mounted on the wiring substrate 101 with high positioning accuracy, as compared with that the assembly of the terminal assemblies 10 is mounted on the assembly of the wiring substrates 101.

As described above, in this embodiment, the terminal assembly 10, in which the plurality of columnar connection terminals 11 that form the interlayer connection conductor are supported by the support body 12, is prepared. However, unlike the terminal assembly of the related art, in which the support body and the connection terminals are integrally formed, the connection terminals 11 that are supported by the support body are formed separately from the support body 12. Accordingly, as compared with the connection terminals of the related art which are integrally formed with the support body, since the connection terminals 11 are formed separately from the support body 12, the terminal assembly 10 prepared in the preparing step is formed such that the plurality of columnar connection terminals 11 having extremely highly precise shapes are supported by the support body 12.

Also, the terminal assembly 10 has the simple configuration, in which the plurality of connection terminals 11 are supported by the support body 12, and there is no material which is etched or cut, and thrown away when the terminal assembly 10 is prepared unlike the case of the related art. Accordingly, the cost for preparing the terminal assembly 10 is decreased. Therefore, the module 100 can be precisely manufactured by mounting the electronic component 102 and the terminal assembly 10 having the simple configuration, in which the plurality of connection terminals 11 are supported by the support body 12, the configuration being highly precise, inexpensive, and new, on the one principal surface of the wiring substrate, and by sealing the electronic component 102 and the terminal assembly 10 mounted on the one principal surface of the wiring substrate 101 with the first resin layer 103.

Also, the plurality of connection terminals 11 are merely supported by the support body 12, and the connection terminals 11 and the support body 12 are separately formed. Therefore, as compared with the terminal assembly with the integral structure of the related art, the support body 12 can be easily removed from the plurality of connection terminals 11, and thus the interlayer connection conductor of the module 100 can be formed of the connection terminals 11. Accordingly, the manufacturing time of the module 100 can be decreased.

Also, the resin is charged onto the one principal surface of the wiring substrate 101 while the support body 12 of the terminal assembly 10 on the one principal surface of the wiring substrate 101 is removed from the connection terminals 11. Accordingly, the filling performance of the resin charged onto the one principal surface of the wiring substrate 101 for forming the first resin layer 103 is increased. Also, when the resin is charged onto the one principal surface of the wiring substrate 101, the support body 12 of the terminal assembly 10 mounted on the one principal surface has been removed. Accordingly, the air easily escapes, and a void can be prevented from being generated in the first resin layer 103.

Also, since the support body 12 of the terminal assembly 10 mounted on the one principal surface of the wiring substrate 101 has been removed, resin in any of various forms, such as a liquid-state resin or a resin sheet, can be used for forming the first resin layer 103. The first resin layer 103 can be easily formed by any of generally known various methods.

Also, the one ends of the connection terminals 11 are supported by the support body 12 by bond or adhesion, and the support body 12 can be easily removed from the connection terminals 11 by decreasing a bond force or an adhesive force of the support body 12.

Also, the surface of the first resin 103 can be flattened by grinding the surface of the first resin layer 103 after the first sealing step.

Also, if the one ends of the connection terminals 11 are cut away together with the surface of the first resin layer 103 in the grinding step, the lands for external connection provided by the one ends of the connection terminals 11 can be easily formed at the surface of the first resin layer 103.

Also, the terminal assembly 10, in which the plurality of columnar connection terminals 11 with extremely highly precise shapes are supported by the support body 12, has the simple configuration, in which the plurality of connection terminals 11 are supported by the support body 12. At the same time, the configuration is highly precise and inexpensive. The one ends of the connection terminals 11 are supported by the support body 12, which is formed of the plate-shaped member with the support layer 13 of the bond layer or the adhesive layer formed on the one surface. Accordingly, the terminal assembly 10 has a highly practical configuration.

Second Embodiment

Figure 4:
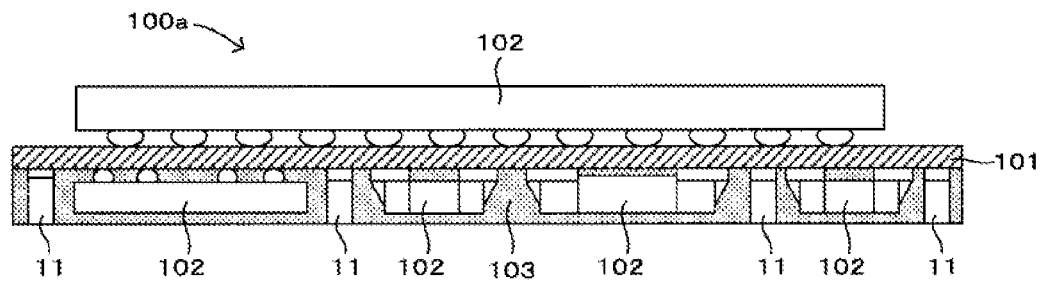
FIG. 4 illustrates a module according to a second embodiment of the invention.

A module according to a second embodiment of the invention is described with reference to FIG. 4. FIG. 4 illustrates the module according to the second embodiment of the invention.

The module according to this embodiment differs from the above-described first embodiment in that, as shown in FIG. 4, an electronic component 102 is further mounted on the other principal surface of the wiring substrate 101 of a module 100a (the second mounting step). While other configurations are similar to the first embodiment, the same reference signs are applied to the similar configurations, and the description of the configurations is omitted. In this embodiment, the protruding portions are not provided at the respective one ends of the connection terminals 11. The end surfaces of the connection terminals 11 form lands for external connection of the module 100a.

Since the electronic component 102 is mounted on the other principal surface of the wiring substrate 101, the mounting density of electronic components 102 that are mounted on the module 100a can be increased. This configuration is practical.

Third Embodiment

Figure 5:
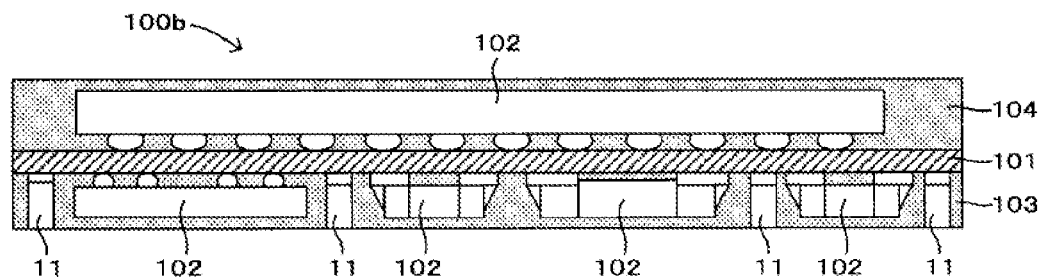
FIG. 5 illustrates a module according to a third embodiment of the invention.

A module according to a third embodiment of the invention is described with reference to FIG. 5. FIG. 5 illustrates the module according to the third embodiment of the invention.

The module according to this embodiment differs from the above-described second embodiment in that, as shown in FIG. 5, the electronic component 102 mounted on the other principal surface of the wiring substrate 101 of a module 100b is sealed with a second resin layer 104 (the second sealing step). While other configurations are similar to the first and second embodiments, the same reference signs are applied to the similar configurations, and the description of the configurations is omitted.

As described above, similarly to the above-described second embodiment, since the electronic component 102 is mounted on the other principal surface of the wiring substrate 101 and the electronic component 102 mounted on the other principal surface of the wiring substrate 101 is sealed with the second resin layer 104, the mounting density of electronic components 102 that are mounted on the module 100b can be increased. This configuration is practical.

Fourth Embodiment

Figure 6:
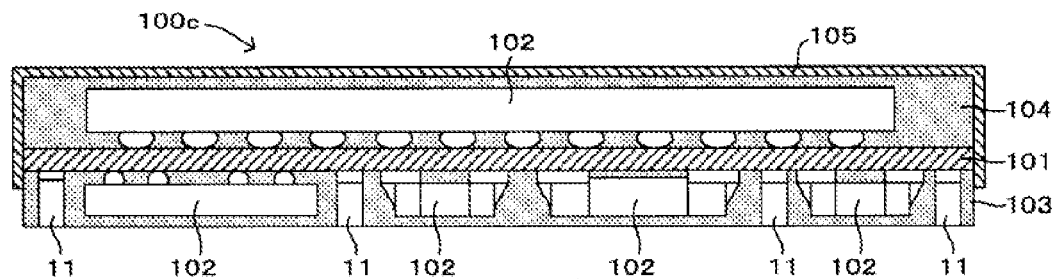
FIG. 6 illustrates a module according to a fourth embodiment of the invention.

A module according to a fourth embodiment of the invention is described with reference to FIG. 6. FIG. 6 illustrates the module according to the fourth embodiment of the invention.

The module according to this embodiment differs from the above-described third embodiment in that, as shown in FIG. 6, a metal shield layer 105 is provided on the second resin layer 104 provided on the other principal surface of the wiring substrate 101 of a module 100c. While other configurations are similar to the first to third embodiments, the same reference signs are applied to the similar configurations, and the description of the configurations is omitted. The metal shield layer 105 is preferably electrically connected with GND wiring provided at the wiring substrate 101.

With this configuration, since the metal shield layer 105 is provided on the second resin layer 104, in particular, noise is prevented from propagating from an outer side portion to the electronic component 102 sealed with the second resin layer 104, and radiation of an electromagnetic wave etc. from the electronic component 102 sealed with the second resin layer 104 is prevented.

Fifth Embodiment

Figure 7:
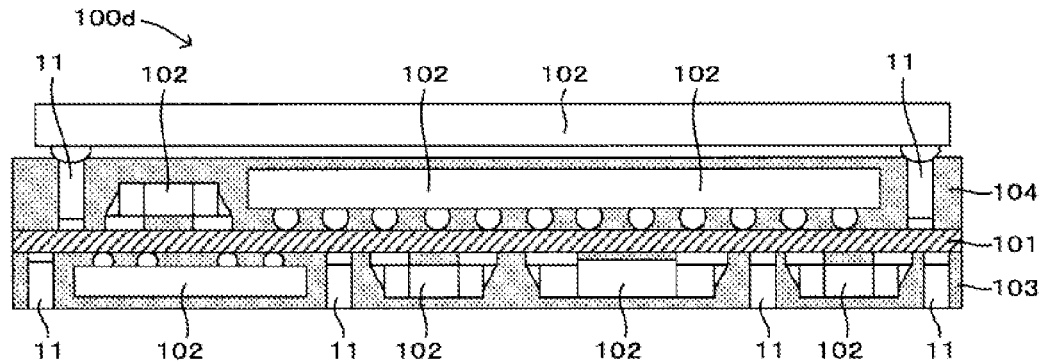
FIG. 7 illustrates a module according to a fifth embodiment of the invention.

A module according to a fifth embodiment of the invention is described with reference to FIG. 7. FIG. 7 illustrates the module according to the fifth embodiment of the invention.

The module according to this embodiment differs from the third embodiment described with reference to FIG. 5 in that, as shown in FIG. 7, the terminal assembly 10 is mounted on the other principal surface of the wiring substrate 101 of a module 100d (the second mounting step), and hence an interlayer connection conductor by the connection terminals 11 is provided in the second resin layer 104. Also, the second resin layer 104 is formed by charging the resin after the support body 12 of the terminal assembly 10 mounted on the other principal surface of the wiring substrate 101 is removed from the connection terminals 11.

Also, in this embodiment, an electronic component 102 is further mounted on the second resin layer 104 so that the electronic component 102 is connected with the interlayer connection conductor formed by the connection terminals 11 provided in the second resin layer 104. While other configurations are similar to the first to fourth embodiments, the same reference signs are applied to the similar configurations, and the description of the configurations is omitted.

With this configuration, the terminal assembly 10 is further mounted on the other principal surface of the wiring substrate 101. Accordingly, the interlayer connection conductor by the connection terminals 11 can be formed in the second resin layer 104. Also, the support body 12 of the terminal assembly 10 on the other principal surface of the wiring substrate 101 is removed from the connection terminals 11 before the electronic component 102 and the terminal assembly 10 mounted on the other principal surface of the wiring substrate 101 are sealed with the second resin layer 104. Accordingly, the resin for forming the second resin layer 104 can be efficiently charged onto the other principal surface of the wiring substrate 101.

Also, the electronic component 102 is further mounted on the second resin layer 104 formed in the second sealing step so that the electronic component 102 is connected with the connection terminals 11 provided in the second resin layer 104. Accordingly, the mounting density of the electronic components 102 that are mounted on the module 100d can be further increased. This configuration is practical.

<Modifications of Connection Terminals>

Figure 8:
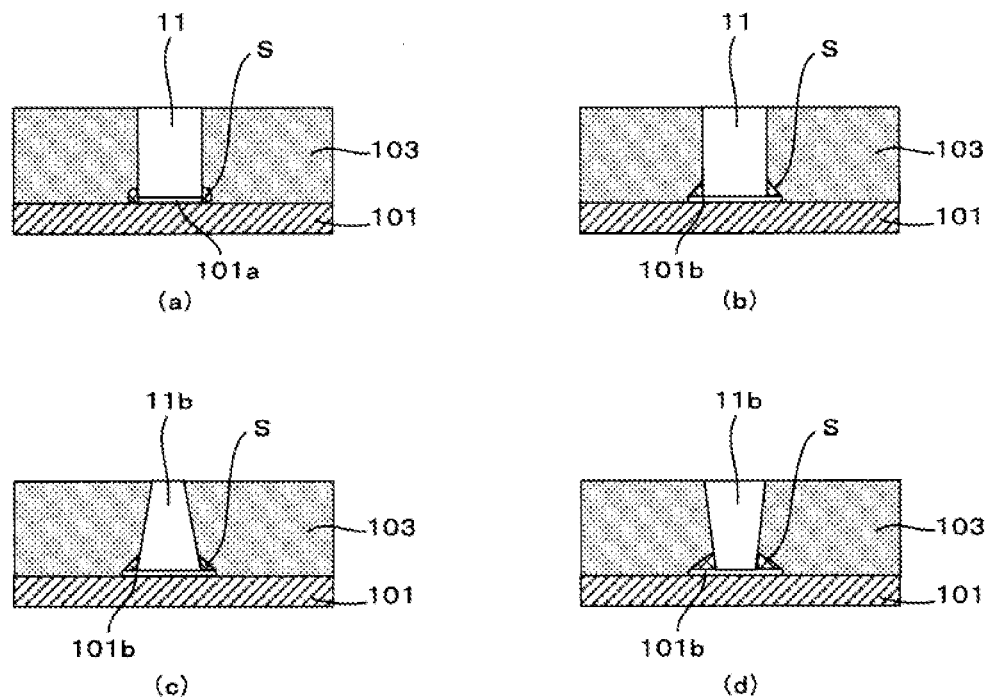
FIG. 8 provides enlarged views of primary portions of connection terminals according to modifications.

Modifications of connection terminals are described with reference to FIG. 8. FIG. 8 provides enlarged views of the primary portions of the connection terminals according to the respective modifications. FIG. 8(a) to FIG. 8(d) show respectively different modifications. FIG. 8(a) to FIG. 8(d) are enlarged views of the respective primary portions. The same reference signs are applied to the configurations similar to those in the first to fifth embodiments, and the description of the configurations is omitted.

In an example shown in FIG. 8(a), a mounting electrode 101a is provided by substantially the same area as the cross-sectional area of the connection terminal 11 on the one principal surface of the wiring substrate 101. The connection terminal 11 is mounted on the mounting electrode 101a while a joining material S such as solder extends to the outside of the mounting electrode 101a. With this configuration, the joining material S extending to the outside of the mounting electrode 101a is hooked to the first resin layer 103. Hence, the connection terminal 11 is prevented from being removed from the first resin layer 103. The joining material S such as solder may be also arranged between the connection terminal 11 and the mounting electrode 101a.

In an example shown in FIG. 8(b), a mounting electrode 101b with a larger area than the cross-sectional area of the connection terminal 11 is provided on the one principal surface of the wiring substrate 101. The connection terminal 11 is mounted on the mounting electrode 101b by the joining material S such as solder. With this configuration, the joining material S extends to the entire mounting electrode 101b with the larger area than the cross-sectional area of the connection terminal 11, and the joining material S extending to the entire mounting electrode 101b is hooked to the first resin layer 103. Accordingly, the connection terminal 11 can be prevented from being removed from the first resin layer 103. The joining material S such as solder may be also arranged between the connection terminal 11 and the mounting electrode 101b.

In an example shown in FIG. 8(c), a connection terminal 11b has a tapered shape. Also, the mounting electrode 101b with a larger area than the cross-sectional area at the large-diameter side of the connection terminal 11b is provided on the one principal surface of the wiring substrate 101. The large-diameter side of the connection terminal 11b is mounted on the mounting electrode 101b by the joining material S such as solder. With this configuration, the connection terminal 11b is wedged into the first resin layer 103. Hence, a large-diameter portion of the connection terminal 11b is hooked to the first resin layer 103, and the joining material S extending to the entire mounting electrode 101b with the larger area than the cross-sectional area at the large-diameter side of the connection terminal 11b is hooked to the resin layer 103. Accordingly, the connection terminal 11b is prevented from being removed from the resin layer 103. The joining material S such as solder may be also arranged between the connection terminal 11b and the mounting electrode 101b. The area of the mounting electrode 101b may be equivalent to the cross-sectional area at the large-diameter side of the connection terminal 11b.

In an example shown in FIG. 8(d), the connection terminal 11b has a tapered shape. Also, the mounting electrode 101b with a larger area than the cross-sectional area at the small-diameter side of the connection terminal 11b is provided on the one principal surface of the wiring substrate 101. The small-diameter side of the connection terminal 11 is mounted on the mounting electrode 101b by the joining material S such as solder. With this configuration, the joining material S extending to the entire mounting electrode 101b with the larger area than the cross-sectional area at the small-diameter side of the connection terminal 11b is hooked to the resin layer 103. Accordingly, the connection terminal 11b is prevented from being removed from the resin layer 103. The joining material S such as solder may be also arranged between the connection terminal 11b and the mounting electrode 101b.

<Modification of Module>

Figure 9:
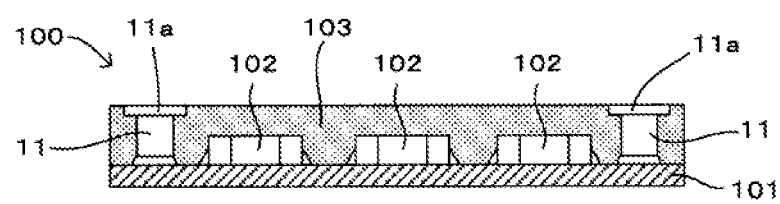
FIG. 9 illustrates a module according to a modification.

Like a module according to a modification shown in FIG. 9, a land for external connection with a larger area than the cross-sectional area of a connection terminal 11 may be formed by a protruding portion 11a, at the same surface as the surface of the first resin layer 103, by partly grinding the protruding portion 11a together with the first resin layer 103 in the grinding step. With this configuration, since the land for external connection with the large area can be provided at the module 100, the electrical connectivity of the module 100 when the module 100 is mounted on a mother board etc. of a communication mobile terminal can be increased. In this case, since the land for external connection (the protruding portion 11a) exposed at the surface of the first resin layer 103 and the connection terminal 11 are integrally formed, as compared with a case in which a land is formed at the connection terminal 11 exposed at the surface of the first resin layer 103 by screen printing or photolithography, the connection strength between the land (the protruding portion 11a) and the connection terminal 11 can be increased.

Also, the protruding portion 11a formed at the one end of the connection terminal 11 can form the land with a large area at the surface of the first resin layer 103. Since the land for external connection with an area required for connecting the module 100 with the mother board etc. is formed at the surface of the first resin layer 103 by the protruding portion 11a, the diameter of the connection terminal 11 can be smaller than the area of the land for external connection (the protruding portion 11a).

In this case, even if the connection terminals 11 are closely arranged in the module 100 so that the lands formed at the surface of the first resin layer 103 by the protruding portions 11a of the respective connection terminals 11 are closely arranged, various types of electronic components 102 can be arranged among the connection terminals 11 and mounted on the wiring substrate 101 so that the electronic components 102 are aligned with the flange-shaped protruding portions 11a of the respective connection terminals 11 in top view. Accordingly, the size of the module 100 can be decreased.

<Modification of Terminal Assembly>

Figure 10:
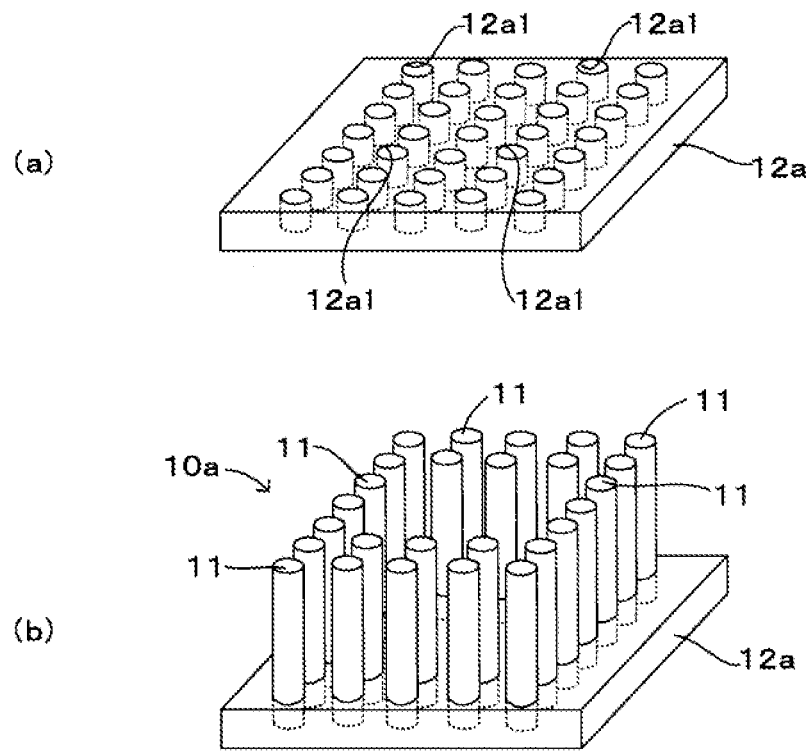
FIGS. 10(a)-(b) illustrate a terminal assembly according to a modification.
Figure 11:
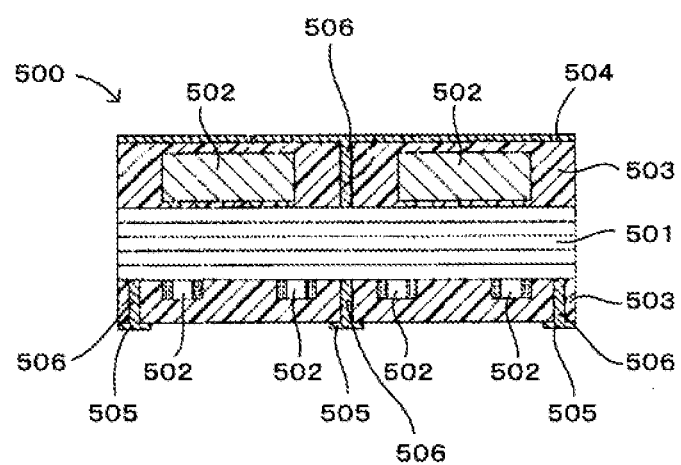
FIG. 11 illustrates an example module of the related art.
Figure 12:
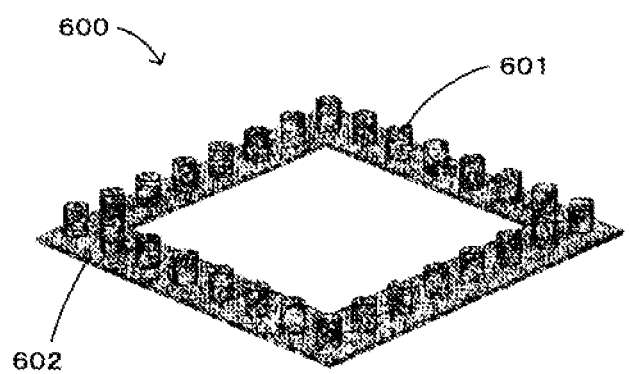
FIG. 12 illustrates an example terminal assembly of the related art.

A modification of a terminal assembly is described with reference to FIG. 10. For configurations similar to the first to fifth embodiments, the same reference signs are applied to the similar configurations, and the description of the configurations is omitted.

A terminal assembly 10a shown in FIG. 10(b) is formed by preparing a support body 12a having holes 12a1 made in a grid form in a resin plate at equivalent intervals for allowing the connection terminals 11 to be inserted as shown in FIG. 10(a), and inserting the columnar connection terminals 11 to the holes 12a1 at positions required for the design form of a module from among the plurality of holes 12a1 formed in the support body 12a as shown in FIG. 10(b).

With this configuration, the terminal assembly 10a can be easily manufactured with a low cost merely by inserting the columnar connection terminals 11 into the holes 12al made in the plate-shaped support body 12a. Also, by inserting the connection terminals 11 into the required holes 12al from among the plurality of holes 12a1 formed in the support body 12a, the terminal assembly 10a corresponding to the type of module can be formed. Hence, it is not required to design the support body 12a for each type of module. The manufacturing cost of the terminal assembly 10a can be decreased.

Alternatively, the support body 12a may be formed by forming holes 12al only at positions required for a resin plate in accordance with the design form of the module. Also, the support body 12a may be formed by injection molding with use of resin, or by making holes in a resin plate.

The invention is not limited to the above-described embodiments, and various modifications may be made other than those described above within the scope of the invention. For example, in any of the above-described embodiments, the support layer 13 is provided on the support body 12 of the terminal assembly 10, and then the connection terminals 11, 11b are supported. However, the support body 12 may be formed of a plate-shaped member of a magnetic material, instead of the provision of the support layer 13 on the support body 12. With this configuration, the one ends of the connection terminals 11 can be attracted by the magnetic force of the plate-shaped member, and hence the connection terminal 11 can be supported by the support body 12. Also, the support body 12 can be easily removed from the connection terminals 11, 11b after the terminal assembly 10 is mounted on the wiring substrate 101.

The present invention can be widely applied to technologies of forming an interlayer connection conductor of a module, by mounting columnar connection terminals on a wiring substrate of the module by using a surface mount technology. By mounting various types of electronic components on the wiring substrate, a module having any of various functions can be formed.

10 terminal assembly
11, 11b connection terminal
11a protruding portion
12 support body
13 support layer (bond layer, support layer)
100, 100a, 100b, 100c, 100d module
101 wiring substrate
102 electronic component
103 first resin layer
104 second resin layer

The invention claimed is:

1. A method of manufacturing a module, comprising:
a providing step of providing a terminal assembly comprising a support body and a plurality of columnar connection terminals forming an interlayer connection conductor and supported by the support body;
a first mounting step of mounting the terminal assembly and one or more electronic components on one principal surface of a wiring substrate; and
a first sealing step of sealing the electronic components and the terminal assembly mounted on the one principal surface of the wiring substrate, with a first resin layer,
wherein the support body of the terminal assembly on the one principal surface of the wiring substrate is removed from the connection terminals after the first mounting step and before the first sealing step.

2. The method of manufacturing the module according to claim 1, wherein one end of each of the connection terminals is supported by the support body by bond or adhesion, and the support body is removed from the connection terminals by decreasing a force of the bond or the adhesive of the support body.

3. The method of manufacturing the module according to claim 2, further comprising a step of grinding a surface of the first resin layer after the first sealing step.

4. The method of manufacturing the module according to claim 1, further comprising a step of grinding a surface of the first resin layer after the first sealing step.

5. The method of manufacturing the module according to claim 4, wherein the one end of each of the connection terminals is shaved in the grinding step.

6. The method of manufacturing the module according to claim 1, further comprising:
a second mounting step of mounting one or more electronic components on another principal surface of the wiring substrate; and
a second sealing step of sealing the electronic components mounted on the another principal surface of the wiring substrate, with a second resin layer.

7. The method of manufacturing the module according to claim 6,
wherein the terminal assembly is further mounted on the another principal surface of the wiring substrate in the second mounting step, and
wherein the support body of the terminal assembly on the another principal surface of the wiring substrate is removed from the connection terminals before the second sealing step.

8. The method of manufacturing the module according to claim 7, wherein one or more electronic components are further mounted on the second resin layer formed in the second sealing step so as to be connected with the connection terminals of the terminal assembly mounted on the other principal surface of the wiring substrate.

9. The method of manufacturing the module according to claim 1, further comprising a step of grinding a surface of the first resin layer after the first sealing step.

* * * * *